United States Patent
Evans

(10) Patent No.: US 7,719,131 B2
(45) Date of Patent: May 18, 2010

(54) APPARATUS FOR MONITORING A SUPPLY SYSTEM, IN PARTICULAR A MOTOR-VEHICLE ELECTRICAL SYSTEM, AND METHOD FOR MONITORING A SUPPLY SYSTEM OF THIS TYPE

(75) Inventor: Howard Evans, Hough (GB)

(73) Assignee: Leoni Wiring Systems UK Limited, Newcastle-under-Lyme, Staffordshire (GB)

( * ) Notice: Subject to any disclaimer, the term of this patent is extended or adjusted under 35 U.S.C. 154(b) by 1211 days.

(21) Appl. No.: 11/286,564

(22) Filed: Nov. 23, 2005

(65) Prior Publication Data
US 2006/0149427 A1 Jul. 6, 2006

(30) Foreign Application Priority Data
Nov. 27, 2004 (DE) .................. 10 2004 057 330

(51) Int. Cl.
*H02G 3/02* (2006.01)
*B60L 3/00* (2006.01)
(52) U.S. Cl. ................. 307/9.1; 307/10.1; 701/29
(58) Field of Classification Search ............ 307/9.1, 307/10.1; 324/771; 701/29; 174/50.52
See application file for complete search history.

(56) References Cited
U.S. PATENT DOCUMENTS

| | | | |
|---|---|---|---|
| 3,860,912 A * | 1/1975 | Romans | 340/870.18 |
| 5,481,194 A | 1/1996 | Schantz et al. | |
| 6,066,389 A | 5/2000 | Glowasky et al. | |
| 6,632,995 B1 * | 10/2003 | Knieriem | 174/50 |
| 6,747,438 B2 * | 6/2004 | Emori et al. | 320/126 |
| 7,091,739 B2 * | 8/2006 | Williams | 324/771 |
| 7,372,176 B2 * | 5/2008 | Kneisel et al. | 307/9.1 |
| 7,505,843 B2 * | 3/2009 | Okada et al. | 701/96 |
| 7,569,947 B2 * | 8/2009 | Imai et al. | 307/9.1 |
| 2002/0027761 A1 | 3/2002 | Ober | |
| 2003/0137319 A1 | 7/2003 | Furukawa | |
| 2003/0230443 A1 | 12/2003 | Cramer et al. | |
| 2004/0232725 A1 | 11/2004 | Marelja | |

FOREIGN PATENT DOCUMENTS

| | | |
|---|---|---|
| DE | 103 08 759 A1 | 9/2004 |
| GB | 2 381 670 A | 5/2003 |
| WO | WO9710697 A1 * | 3/1997 |

* cited by examiner

*Primary Examiner*—Albert W Paladini
(74) *Attorney, Agent, or Firm*—Laurence A. Greenberg; Werner H. Stemer; Ralph E. Locher

(57) ABSTRACT

In order to monitor an electrical supply system, in particular of a motor vehicle, which is at least partially mounted on a carbon-fiber supporting structure, a monitoring unit is provided and electrically connected to the carbon-fiber supporting structure at preferably a plurality of measurement points. Voltage values are tapped off at the measurement points and compared with permissible voltage values. If the voltage values exceed permissible maximum limits, on account of a short circuit for example, this is judged to be an indication of an impermissible current across the carbon-fiber supporting structure, and a power source is disconnected from the supply system, in particular.

13 Claims, 1 Drawing Sheet

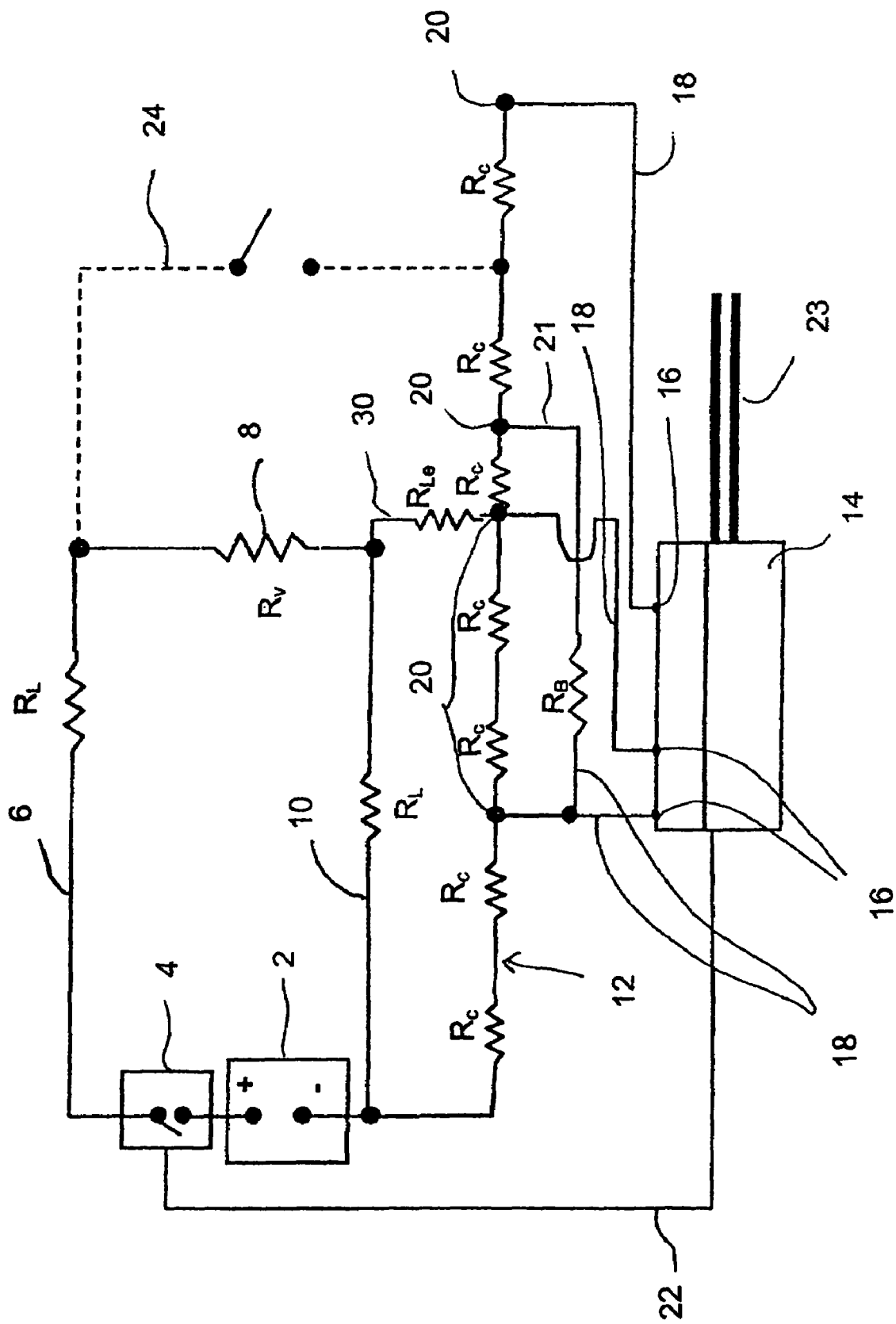

APPARATUS FOR MONITORING A SUPPLY SYSTEM, IN PARTICULAR A MOTOR-VEHICLE ELECTRICAL SYSTEM, AND METHOD FOR MONITORING A SUPPLY SYSTEM OF THIS TYPE

BACKGROUND OF THE INVENTION

Field of the Invention

The invention relates to an apparatus and to a method for monitoring a supply system, in particular a motor-vehicle electrical system.

Efforts are being made to develop motor vehicles such that some regions of the body or the entire vehicle body are configured as a carbon-fiber supporting structure made of a carbon-fiber material. The particular advantages of the carbon-fiber material are its good mechanical characteristics and its low specific weight. Special solutions are necessary on account of its electrical characteristics which are different from those of a metal body, for example in terms of its conductivity or shielding against high-frequency disturbances etc.

In the case of a metal body, the body itself is usually used as part of the electrical circuit and thus as part of the vehicle electrical system, and is often used as a connection to ground. This is readily possible on account of the good conductivity of the metal body. However, when carbon-fiber material is used, such incorporation of the body into the vehicle electrical system would lead to problems. Although the carbon-fiber material is electrically conductive, the material has a considerably lower conductivity compared to metal. With large amounts of current, the increased resistance may cause considerable heating up and thus thermal damage. On account of the carbon fraction, there is even a risk of fire if an igniting power source is used.

SUMMARY OF THE INVENTION

It is accordingly an object of the invention to provide an apparatus for monitoring a supply system, in particular a motor-vehicle electrical system, and a method for monitoring a supply system of this type that overcome the above-mentioned disadvantages of the prior art devices and methods of this general type, which make it possible to reliably combine a supply system with a carbon-fiber supporting structure, in particular to connect a motor-vehicle electrical system to a carbon-fiber body.

According to the invention, provision is made for in particular a motor-vehicle electrical system to be at least partially mounted on a carbon-fiber supporting structure, in particular a carbon-fiber body, that is to say to be mechanically connected to the supporting structure. The vehicle electrical system contains at least one electrical load which is connected to a power source both via a supply line and a return line. In order to be able to detect an impermissible state, for example a short circuit or a defective line, a monitoring unit is also provided and electrically connected to the carbon-fiber supporting structure at at least one measurement point, preferably at a plurality of spaced-apart measurement points.

The phrase "at least partially mounted on the carbon-fiber supporting structure" is to be understood as only the mechanical arrangement of at least parts of the vehicle electrical system on the carbon-fiber supporting structure which constitutes a potential current path to or from the power source.

This refinement is based on the consideration that an impermissibly high amount of current flows across the carbon-fiber supporting structure when there is a fault, and this leads to an increase in a voltage potential which can be tapped off from the carbon-fiber supporting structure. On account of the conductivity only being low, the voltage potential varies as a function of the measurement location, with the result that different voltage values may occur at different measurement points. On account of the voltage potentials being detected and monitored on the carbon-fiber supporting structure, the apparatus therefore detects an impermissible current flow and suitable measures can be taken to protect the vehicle electrical system and/or to protect the entire vehicle.

A disconnecting switch for disconnecting the power source from the supply system is expediently provided and can be actuated by the monitoring unit. If there is a fault, it is therefore possible to disconnect the power source from the supply system and thus turn off the entire vehicle electrical system in order to prevent further damage.

According to one preferred refinement, comparison data for permitted measurement states is stored, particularly in the monitoring unit itself. The monitoring unit is additionally configured such that a deviation of the measured values from the permitted measurement states is judged to be a fault state. In this case, the monitoring unit then generates a fault signal, particularly a switch-off signal, to the disconnecting switch for disconnecting the power source. This refinement is based on the consideration that, during the normal operating state, it is entirely possible for small currents to flow across the carbon-fiber supporting structure, these currents being attributable, for example, to the fact that the metal housings of loads are arranged directly on the carbon-fiber supporting structure, and the housing forms the connection to ground. Permissible voltage values are therefore established across the carbon-fiber supporting structure. The level of the permissible voltage values which occurs at a specific position depends on the respective actual state of the loads. The states are determined particularly in accordance with whether the individual loads are switched on or switched off, and the combination of loads which are operated. As a function of the state, a large number of permitted voltage and measurement states are therefore possible overall, with the result that the comparison data for the permitted measurement states can be illustrated in envelope curves for the permissible measured value. Envelope curves of this type are therefore preferably stored in the monitoring unit.

In one advantageous development, the monitoring unit is connected to a data bus via which it receives information about the actual situation of the loads of the vehicle electrical system. As a function of the transmitted actual situation, the monitoring unit determines the measurement states that can be expected.

The measurement state that can be expected is expediently taken directly from the comparison data which is stored as envelope curves in particular and may, for example, also be stored in a table. This measure results in that it is possible to precisely determine the permissible values such that they are matched to the actual situation, so that it is possible to determine whether or not a fault state exists with a higher degree of accuracy, as a result of which the reliability of the system is increased overall.

In one expedient development, the monitoring unit additionally receives information about the vehicle state detected by at least one further sensor, for example an impact sensor. This information is evaluated and, in particular, the disconnecting switch is actuated when the vehicle state is not permissible. The monitoring unit is therefore configured in the manner of a central monitoring unit in which a plurality of safety-relevant items of information are combined, with the decision as to whether the battery is disconnected from the supply system or not being made in the monitoring unit. In the event of accidents in particular, the most immediate disconnection of the battery possible is an essential safety feature for preventing consequential damage following an accident, for example by igniting petrol which is flowing out.

Other features which are considered as characteristic for the invention are set forth in the appended claims.

Although the invention is illustrated and described herein as embodied in an apparatus for monitoring a supply system, in particular a motor-vehicle electrical system, and a method for monitoring a supply system of this type, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

The single FIGURE of the drawing is an circuit diagram of a motor-vehicle electrical system according to the invention, in particular of a motor vehicle which has a carbon-fiber supporting structure in at least some regions, the carbon-fiber supporting structure being at least partially in mechanical contact with the vehicle electrical system, that is to say having points of contact.

DESCRIPTION OF THE PREFERRED EMBODIMENTS

Referring now to the single FIGURE of the drawing in detail, there is shown a motor-vehicle electrical system which contains a DC power source 2 which is configured as a battery, a disconnecting switch 4 which is connected downstream of the power source 2 to a positive pole, an electrical supply line 6 which connects the positive pole of the power source 2 to an electrical load 8, and an independent electrical return line 10 which is connected to the negative pole of the power source 2. Both the supply line 6 and the return line 10 are configured as separately laid lines. A multiplicity of loads 8 are usually disposed in the motor-vehicle electrical system.

The FIGURE illustrates a carbon-fiber supporting structure 12 as an electrical connection to the power source 2 which runs parallel to the return line 10. In physical terms, this results in a potential electrical path from the load 8 to the power source 2, at least partial sections of which path run across the carbon-fiber supporting structure 12. Provision is also made of a monitoring unit 14 which has a total of three monitoring inputs 16 in the exemplary embodiment. Monitoring lines 18 are routed from the monitoring inputs to various measurement points 20 on the carbon-fiber supporting structure 12. A voltage produced on the carbon-fiber supporting structure 12 at the measurement points 20 is tapped off at the measurement points 20. The schematic illustration also shows a bridging line 21 which is formed, for example, by a metal component which is directly connected to the carbon-fiber supporting structure 12 and results in the points on the carbon-fiber supporting structure 12 which are connected to one another via the bridge 21 being at the same potential.

At an output end, the monitoring unit 14 has a control output which is connected to the disconnecting switch 4 via a control line 22. In addition, it is connected to a data bus 23 at an input end. The monitoring unit 14 receives its power from the power source 2 or from a separate power source.

A switch which indicates a possible short circuit via a short-circuit path 24 (illustrated by a dashed line) is illustrated parallel to the electrical load 8.

Various resistances are indicated in the individual current paths and in the carbon-fiber supporting structure 12. In this case, $R_L$ is the line resistance of the supply line 6 and, respectively, of the return line 10, $R_V$ is the load resistance, each $R_C$ is a partial resistance of the carbon-fiber supporting structure 12, and $R_B$ is the resistance of the bridging line 21. Since the conductivity is only low, the total resistance of the carbon-fiber supporting structure 12 may be illustrated as the sum of many individual distributed partial resistances $R_C$.

Furthermore, an electrical connection is illustrated between the return line 10 and the carbon-fiber supporting structure 12 and forms a leakage path 30 having a leakage resistance $R_{Le}$. The leakage path 30 is a potential current path back to the power source 2 through the body structure 12. This potential current path is formed as a result of the close mechanical installation of the load 8 on the carbon-fiber supporting structure 12. Particularly the metal housings of the loads 8, with which the loads are mounted on the body structure 12, are usually connected to ground, that is to say to the negative pole of the power source 2, to simultaneously improve the shielding performance.

In the normal state, the current will flow almost exclusively via the supply line 6 and the return line 10 when the load 8 is switched on, since the line resistance $R_L$ is very low and typically of the order of magnitude of milliohms (mΩ). In contrast, the resistance value of $R_C$ is a few hundred milliohms mΩ to several ohms per square millimeter. The load resistance $R_V$ is typically in the region of one ohm. The resistance of the bridging line $R_B$ is of the same order of magnitude as the line resistance $R_L$ and is therefore considerably lower than the resistance of the carbon-fiber material $R_C$.

A small leakage current can flow via the leakage path 30 and the carbon-fiber structure 12 even during normal operation, but the leakage current is not yet critical in terms of safety. A potential divider is therefore formed in the carbon-fiber supporting structure 12, with the result that different voltage values are produced at the various measurement points 20 and are measured and evaluated by the monitoring unit 14. Even during normal operation, different permitted potential states are established in distributed fashion across the carbon-fiber supporting structure 12 depending on the number of loads 8 that are actually switched on and as a function of the respective load state of the various loads 8. These permitted permissible potential states are stored in the monitoring unit 14 as comparison data for each of the individual measurement points 20. The actual state data of the loads 8 is transmitted, for example, from a central control unit to the monitoring unit 14 via the data bus 23.

In order to monitor the vehicle electrical system, the voltage values at the measurement points 20 are detected and evaluated continuously or at discrete time intervals. If the measured voltage values deviate impermissibly from the stored comparison values or comparison data, this is detected as a fault state and the monitoring unit 14 outputs a corresponding fault signal at the control output via the control line 22. A fault signal of this type is, for example, an audible or visual signal for warning the vehicle owner. As an alternative to this, provision is made for a fault signal in the form of a switch-off signal to be transmitted to the disconnecting switch 4, so that the power source 2 is disconnected from the supply system and the entire vehicle electrical system is turned off. Such disconnection is performed in the case of severe disturbances in particular. In this case, provision may be made for certain emergency functions to be maintained initially, in order for it to still be possible to drive the vehicle to the nearest garage, for example. A plurality of disconnecting switches 4, which are used to switch off only parts of the vehicle electrical system, may therefore also be provided.

The measurement points 20 are, for example, integrated in existing loads 8 and their conductive devices which are mounted on the carbon-fiber supporting structure 12. As an alternative to this, the measurement points 20 may also be sensor connections set up specifically for this purpose.

The monitoring unit 14 is therefore used to distinguish between the normal potential values that are to be expected and abnormal faulty potential values, and suitable measures are executed, in particular the power source 2 is switched off.

The fault is caused, for example, by the short circuit between the vehicle electrical system and the carbon-fiber supporting structure 12, which short circuit is shown as the short-circuit path 24. On account of the short circuit, an impermissibly high current, which constitutes a source of danger and may under certain circumstances cause a fire, will flow across the carbon-fiber supporting structure 12. Since the carbon-fiber supporting structure 12 as a whole forms a comparatively high resistance, there is the risk that a fuse which may be present will not respond when a short circuit occurs, and that the short circuit will therefore remain undetected. The voltage values, which are increased on account of the short circuit, are now detected as fault states by the monitoring unit, and suitable measures may be taken.

A further possible fault source is damage to the return line 10. In this case, connection to the negative pole of the power source 2 is not made via the return line 10, but rather via the leakage path 30 and via the carbon-fiber supporting structure 12, which then form the primary current path. The leakage resistance $R_{Le}$ is usually much greater than the load resistance $R_L$, with the result that an effective power source can be assumed directly through the carbon-fiber supporting structure 12 on account of the voltage-divider effect, that is to say virtually the entire voltage applied is dropped across the carbon-fiber supporting structure 12. The current flowing via the leakage path 30 will therefore increase considerably compared to the normal case and may assume values comparable to those in the event of a short circuit under certain circumstances. In this case too, the voltage potential at the measurement points 20 will increase compared to the fault-free normal state, with the result that the fault can be detected and the power source 2 can be switched off.

The monitoring unit 14 is preferably a central monitoring unit which, in addition to transmitting information about the actual states of the individual loads 8 via the data bus 23, also transmits further additional information from further sensors (not illustrated in any more detail here). Sensors of this type are, for example, so-called crash sensors which respond in the event of an accident. If a signal of this type is produced, the monitoring unit likewise outputs a fault signal, in particular it actuates the disconnecting switch 4 to switch off the power source 2.

This application claims the priority, under 35 U.S.C. §119, of German patent application No. 10 2004 057 330.1-35, filed Nov. 27, 2004; the entire disclosure of the prior application is herewith incorporated by reference.

I claim:

1. An apparatus for monitoring a supply system being at least partially mounted on a carbon-fiber supporting structure and the supply system connecting an electrical load to a power source, via a supply line and a return line, the apparatus comprising:
    a monitoring unit electrically connected to the carbon-fiber supporting structure at at least one measurement point.

2. The apparatus according to claim 1, further comprising a disconnecting switch for disconnecting the power source from the supply system, said disconnecting switch connected to and actuated by said monitoring unit.

3. The apparatus according to claim 1, wherein said monitoring unit stores comparison data for permitted measurement states, and said monitoring unit configured such that a deviation from the permitted measurement states is judged to be a fault state.

4. The apparatus according to claim 1, further comprising a data bus connected to said monitoring unit, and through said data bus, said monitoring unit receives information about an actual situation of the load of a vehicle electrical system and said monitoring unit uses the information for determining measurement states that can be expected.

5. The apparatus according to claim 2, wherein said monitoring unit additionally receives information about a vehicle state, and said monitoring unit actuating said disconnecting switch when the vehicle state is not permissible.

6. The apparatus according to claim 1, wherein the supply system is a motor-vehicle electrical system.

7. A motor-vehicle electrical system to be at least partially mounted on a carbon-fiber supporting structure, said motor-vehicle electrical system comprising:
    a power source to be connected to an electrical load;
    a supply line connected between said electrical load and said power source;
    a return line connected between said electrical load and said power source; and
    a monitoring unit electrically connected to the carbon-fiber supporting structure at at least one measurement point.

8. A method for monitoring a supply system being at least partially mounted on a carbon-fiber supporting structure and the supply system connecting an electrical load to a power source via a supply line and a return line, which comprises the steps of:
    providing a monitoring unit for tapping off a voltage value at least at one measurement point on the carbon-fiber supporting structure; and
    evaluating the voltage value.

9. The method according to claim 8, which further comprises disconnecting the power source from the supply system if an impermissible state is detected.

10. The method according to claim 8, which further comprises:
    comparing, via the monitoring unit, the voltage value with comparison data for permitted measurement states; and
    outputting a fault signal when the voltage value deviates from the permitted measurement states.

11. The method according to claim 10, which further comprises:
    receiving, in the monitoring unit, information about an actual situation of the load of the supply system via a data bus; and
    determining from the information the permitted measurement states that can be expected.

12. The method according to claim 8, which further comprises:
    sending the monitoring unit additional information about a vehicle state; and
    disconnecting the power source from the supply system if the vehicle state is not permissible.

13. The method according to claim 8, which further comprises providing the supply system as an electrical supply system of a motor vehicle.

* * * * *